(12) United States Patent
Nagai et al.

(10) Patent No.: US 7,712,007 B2
(45) Date of Patent: May 4, 2010

(54) SEMICONDUCTOR MEMORY DEVICE HAVING DATA HOLDING MODE USING ECC FUNCTION

(75) Inventors: Takeshi Nagai, Yokohama (JP); Shinji Miyano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 902 days.

(21) Appl. No.: 11/531,895

(22) Filed: Sep. 14, 2006

(65) Prior Publication Data
US 2007/0079219 A1    Apr. 5, 2007

(30) Foreign Application Priority Data
Sep. 16, 2005  (JP) .............................. 2005-271150
Aug. 23, 2006  (JP) .............................. 2006-226798

(51) Int. Cl.
*H03M 13/00*    (2006.01)
(52) U.S. Cl. ..................................... 714/754
(58) Field of Classification Search ................. 714/746, 714/754, 763, 764
See application file for complete search history.

(56) References Cited

U.S. PATENT DOCUMENTS

| | | | | |
|---|---|---|---|---|
| 5,127,014 A | * | 6/1992 | Raynham | 714/754 |
| 7,334,179 B2 | * | 2/2008 | Zhang et al. | 714/764 |
| 7,373,584 B2 | * | 5/2008 | Ito et al. | 714/763 |
| 2006/0236206 A1 | * | 10/2006 | Otsuka et al. | 714/763 |

FOREIGN PATENT DOCUMENTS

JP    2002-56671    2/2002

* cited by examiner

*Primary Examiner*—Shelly A Chase
(74) *Attorney, Agent, or Firm*—Oblon, Spivak, McClelland, Maier & Neustadt, L.L.P.

(57) ABSTRACT

When memory cells enter an operation mode which performs only data holding, a control circuit controls the memory cells and an ECC circuit as follows. A plurality of data are read out to generate and store a check bit for error detection and correction. Refreshing is performed in a period within the error occurrence allowable range of an error correcting operation performed by the ECC circuit by using the check bit. Before a normal operation mode is restored from the operation mode which performs only data holding, an error bit of the data is corrected by using the check bit. In an entry/exit period, read/write and an ECC operation are sequentially performed for all the memory cells by a page mode operation. Memory cells connected to a word line which is not accessed by the page mode operation are sequentially activated and refreshed.

20 Claims, 14 Drawing Sheets

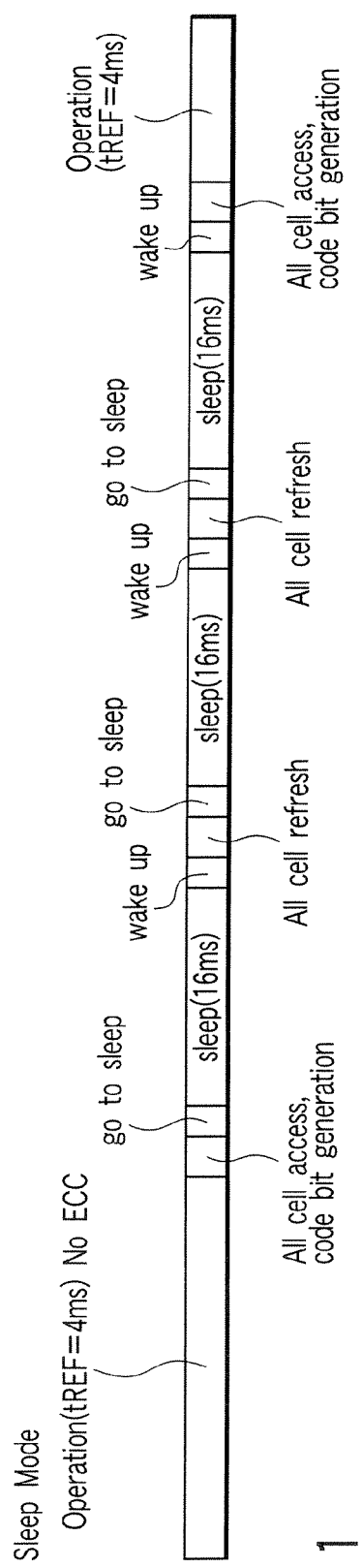
F I G. 1
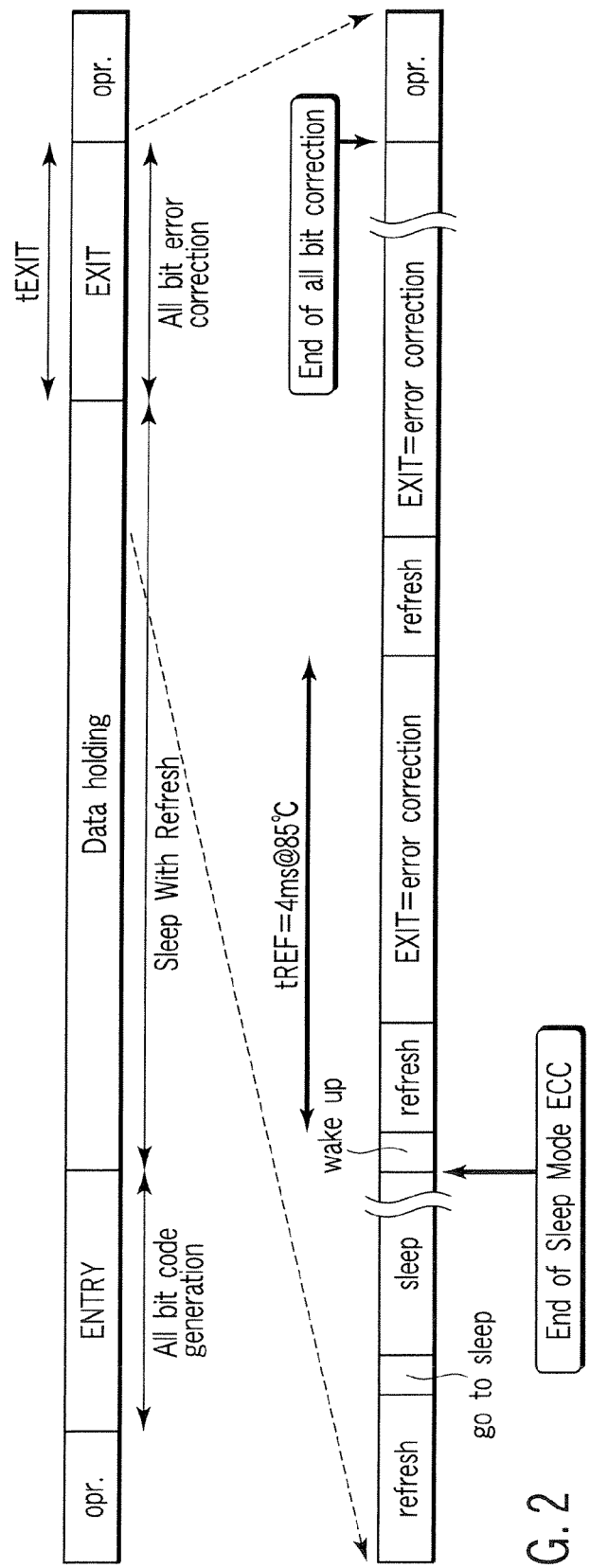
F I G. 2

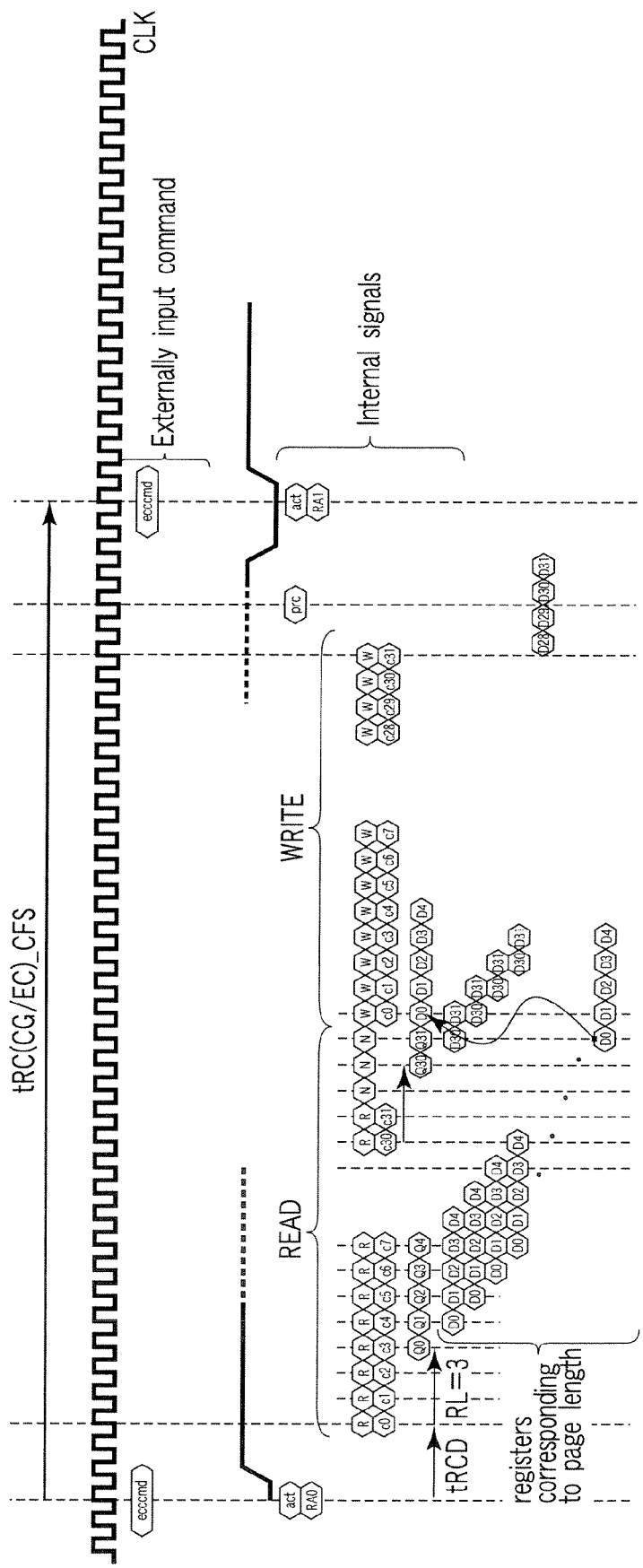
F I G. 11

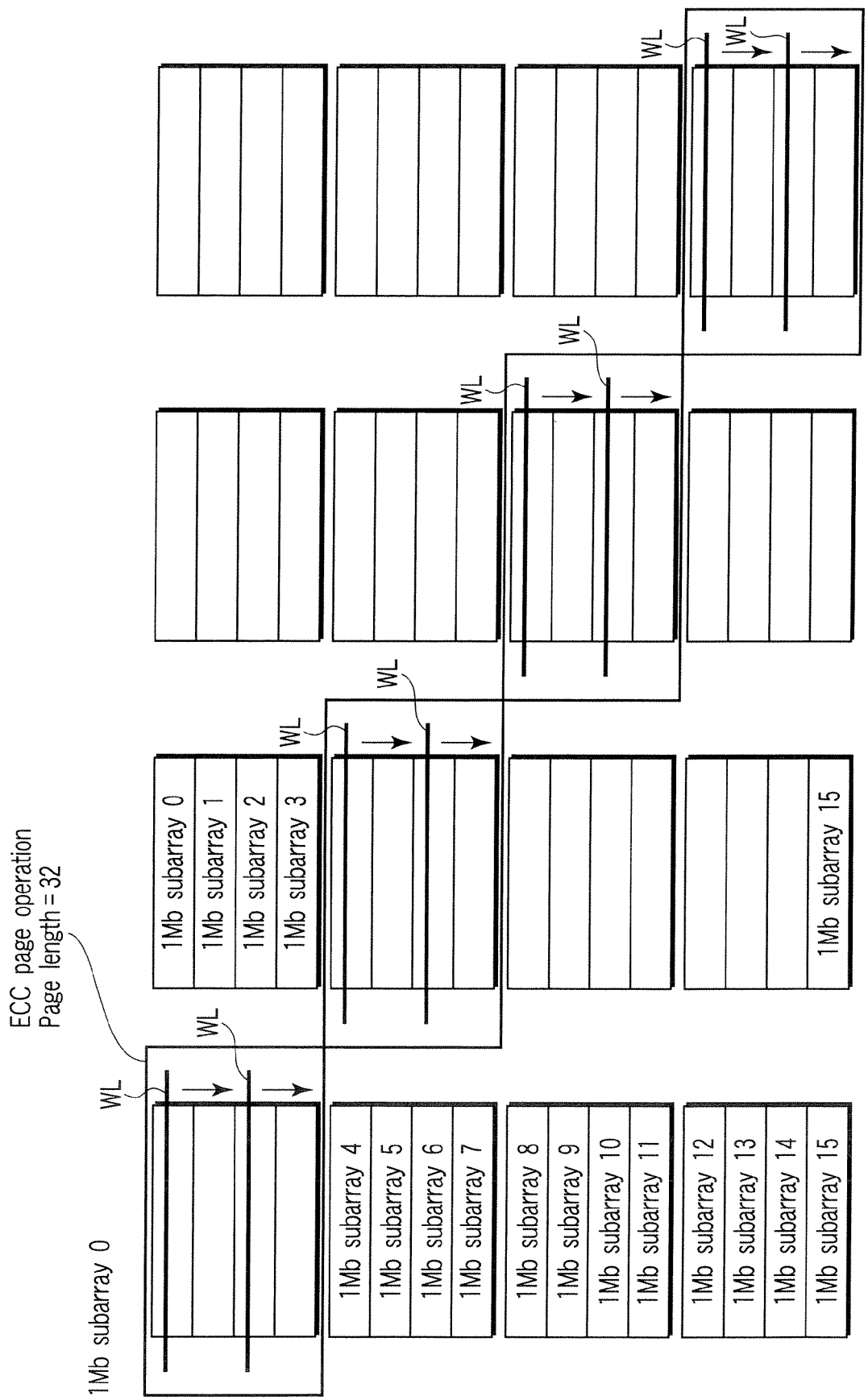

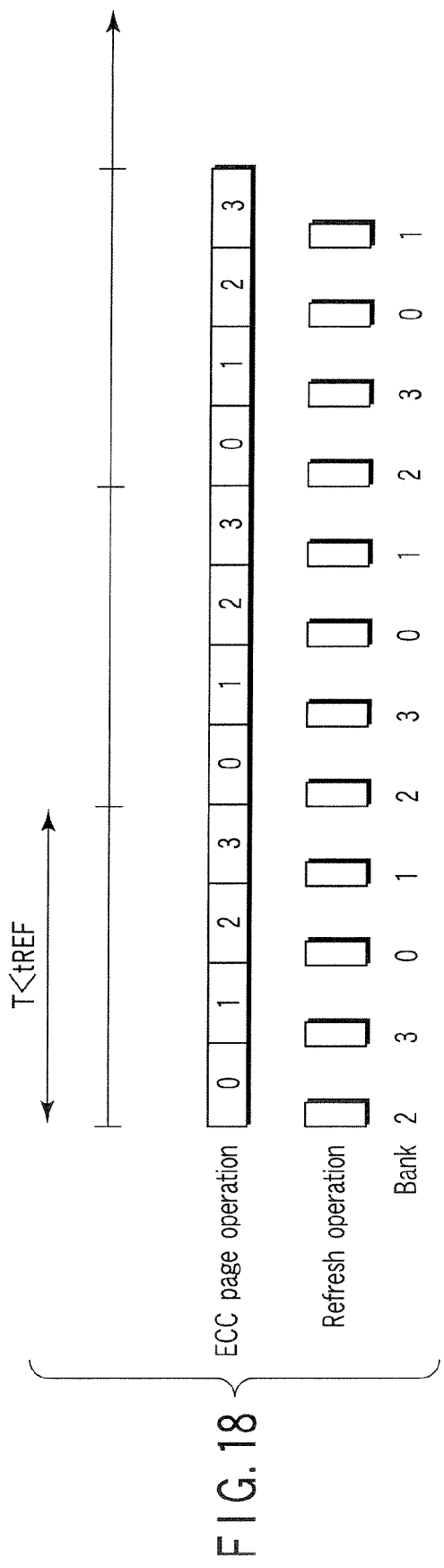
F I G. 18
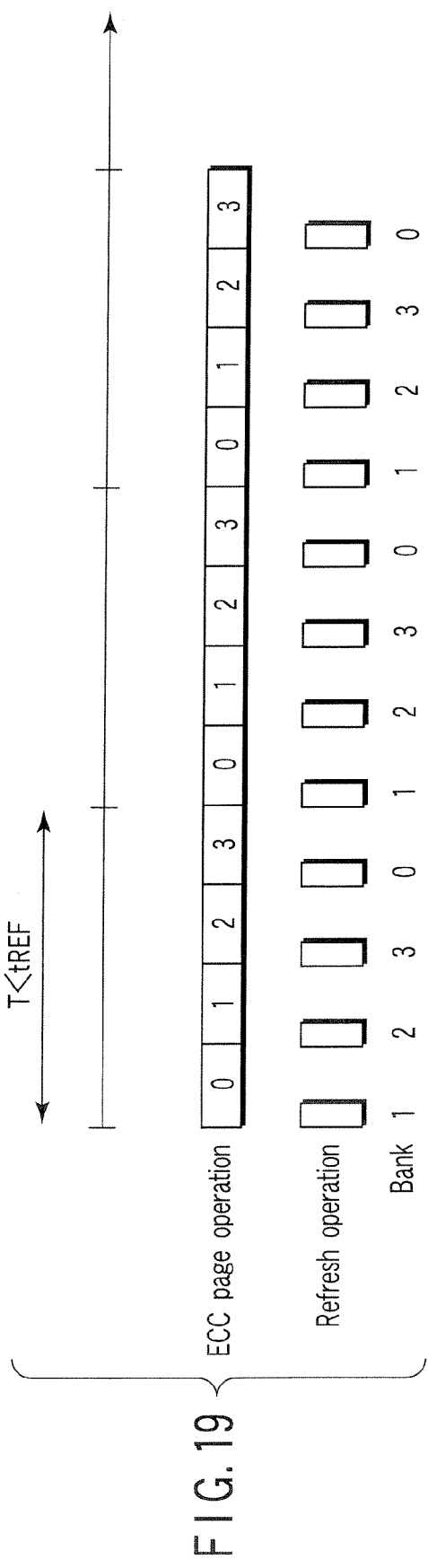
F I G. 19

SEMICONDUCTOR MEMORY DEVICE HAVING DATA HOLDING MODE USING ECC FUNCTION

CROSS-REFERENCE TO RELATED APPLICATIONS

This application is based upon and claims the benefit of priority from prior Japanese Patent Applications No. 2005-271150, filed Sep. 16, 2005; and No. 2006-226798, filed Aug. 23, 2006, the entire contents of both of which are incorporated herein by reference.

BACKGROUND OF THE INVENTION

1. Field of the Invention

The present invention relates to a semiconductor memory device, e.g., a dynamic random access memory (DRAM), having a data holding mode using an ECC function.

2. Description of the Related Art

A conventionally known example of a semiconductor memory device of this type is "a data holding method of a dynamic RAM and a semiconductor integrated circuit device" disclosed in Jpn. Pat. Appln. KOKAI Publication No. 2002-56671. This patent reference has proposed a method of correcting error bits as follows at the start of an operation mode in which a DRAM performs only a data holding operation. That is, when this operation mode starts, parity bits (or check bits) for detecting and correcting errors are generated and stored for a plurality of data, and refreshing is performed by extending the refresh period within the error occurrence allowable range of an error correcting operation using the parity bits. Before the data holding operation returns to a normal operation, error bits are corrected by using the data and parity bits.

FIG. 23 of the patent reference described above is a timing chart showing timings from the end of an entry operation to the start of the data holding mode, and timings from the data holding mode to the start of an exit operation. In this method, reading of data from all memory cells and write of generated parity bits is performed in an entry period during which the normal operation changes to the data holding mode. Also, in an exit period during which the data holding mode changes to the normal operation, codes, i.e., information bits and the parity bits are read out from all the memory cells, errors are detected and corrected, and the corrected data is rewritten.

In the semiconductor memory device having the above arrangement, however, the transition time from the normal operation to the data holding mode or the transition time from the data holding mode to the normal operation is longer than the refresh time, so a row which is not accessed within the refresh time may exist. In addition, when the ECC function is to be used by a column-address-priority page operation, refreshing must be performed by interrupting the page operation which is accessing all cells, in order to satisfy the limitation of the refresh time. This makes control difficult.

BRIEF SUMMARY OF THE INVENTION

According to an aspect of the present invention, there is provided a semiconductor memory device comprising memory cells which dynamically hold data, ECC circuits configured to perform error correction on codes read out from the memory cells, and a control circuit configured to control operations of the memory cells and operations of the ECC circuits, the control circuit performing control such that when the memory cells enter an operation mode which performs only data holding, a plurality of data are read out to generate and store a check bit for error detection and correction, and refresh is performed in a period within an error occurrence allowable range of the error correcting operation performed by the ECC circuit by using the check bit, and, before a normal operation mode is restored from the operation mode which performs only data holding, an error bit of the data is corrected by using the check bit, wherein in an entry/exit period, read/write and an ECC operation are sequentially performed for all the memory cells by a page mode operation, and memory cells connected to a word line which is not accessed by the page mode operation are sequentially activated and refreshed.

According to another aspect of the present invention, there is provided a semiconductor memory device comprising a plurality of banks having memory cell arrays in which memory cells which dynamically hold data are arranged, ECC circuits configured to perform error correction on codes read out from the memory cells, and a control circuit configured to control operations of the memory cells and operations of the ECC circuits, the control circuit performing control such that when the memory cells enter an operation mode which performs only data holding, a plurality of data are read out to generate and store a check bit for error detection and correction, and refresh is performed in a period within an error occurrence allowable range of the error correcting operation performed by the ECC circuit by using the check bit, and, before a normal operation mode is restored from the operation mode which performs only data holding, an error bit of the data is corrected by using the check bit, wherein in an entry/exit period, read/write and an ECC operation are sequentially performed for all the memory cells by a page mode operation, and, in the entry/exit period, one bank is accessed by an ECC page mode, another bank is refreshed while the read/write and the ECC operation are performed, the ECC page mode is not interrupted by the refresh, and the refresh is performed for all the memory cells within a predetermined time.

BRIEF DESCRIPTION OF THE SEVERAL VIEWS OF THE DRAWING

FIG. 1 is a schematic view for explaining an outline of the operation of a semiconductor memory device as the premise of the present invention, in which a data holding mode is illustrated;

FIG. 2 is a schematic view for explaining precautions of refreshing during entry and exit periods;

FIG. 11 is a timing chart of an operation for a page length of 32 bits in the case of CFS;

FIGS. 12A to 12D are schematic views for explaining word lines to be activated when the page length is 32;

FIG. 18 is a schematic view for explaining a semiconductor memory device according to the third embodiment of the present invention; and FIG. 19 is a schematic view for explaining a semiconductor memory device according to the fourth embodiment of the present invention.

DETAILED DESCRIPTION OF THE INVENTION

Figure 3:
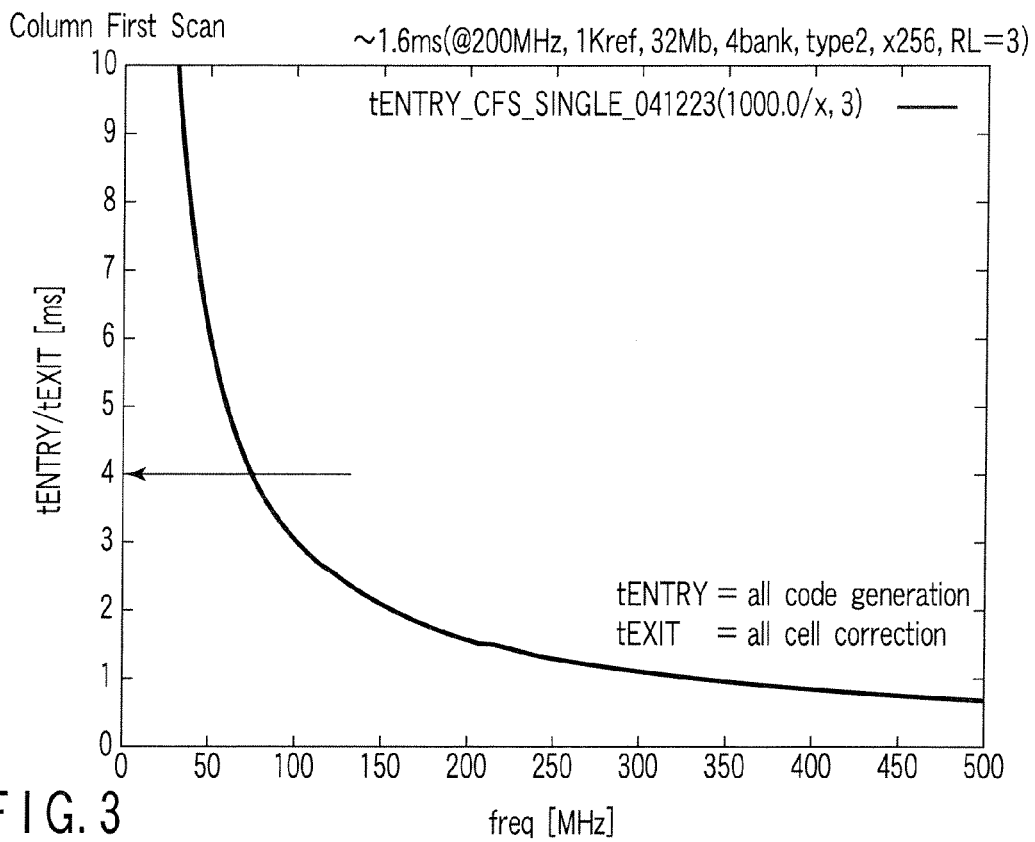
FIG. 3 is a diagram roughly estimating the entry/exit transition time in the case of column-first scan (CFS)

FIG. 1 is a schematic view showing an outline of the operation of the semiconductor memory device (DRAM) as the premise of the present invention, in which a data holding mode is illustrated. In a normal operation, this semiconductor memory device operates at refresh interval tREF=4 ms (no ECC). To start the data holding mode, code bits are generated by accessing all memory cells and written in the memory cells in an entry period. Since the present invention is premised on the use of organizing codes, information bits are directly contained in the code bits. A portion of code bits from which information bits are omitted will be referred to as parity bits hereinafter. Only the parity bits need be written in the memory cells during the entry period. After code bits are written by accessing all the cells, the data holding mode starts.

In the operation shown in FIG. 1, a sleep mode starts at the end of entry in order to reduce the power consumption. A so-called MT-CMOS technique or VT-CMOS technique is known as a technique which implements this sleep mode. In the MT (Multi-Threshold)-CMOS technique, a switching transistor with high threshold voltage is provided between a GND line and the source of a MOSFET connected to the GND side of a transistor forming a memory peripheral circuit, or a switching transistor with high threshold voltage is provided between a power supply line and the source of a MOSFET connected to the power supply side of a transistor forming a memory peripheral circuit, for example, and a leakage current is reduced by turning off the switching transistor. The VT (Variable-Threshold)-CMOS technique reduces a leakage current by changing the threshold voltage by adjusting the back gate bias of a MOSFET. That is, the sleep mode herein mentioned means a state in which a leak cut operation is performed by the semiconductor memory device.

When the data holding mode starts, the refresh interval tREF can be increased by an ECC function. For example, tREF=4 ms in the normal operation can be increased to tREF=16 ms in the data holding mode. However, at least one refresh operation of all cells is necessary within tREF=16 ms from the start of the data holding mode. To perform the refresh operation, it is necessary to restore the power supply and changed threshold voltage of a leak-cut circuit required for the operation. Before refreshing all cells, therefore, a "wake up" operation for returning from sleep is necessary, and a "go to sleep" operation for restarting the sleep mode at the end of the refresh of all cells is also necessary.

To advance to the normal operation mode from this repetition of sleep→"wake up"→refresh→"go to sleep", it is initially necessary to perform a decoding operation by accessing all cells during an exit period after "wake up" from sleep. That is, code bits are read out, errors are detected and corrected, and the corrected data is rewritten in memory cells. When data decoding of all the cells is completed, the normal operation mode starts.

FIG. 2 is a schematic view for explaining precautions of the refresh operation during the entry and exit periods. More specifically, FIG. 2 shows an operation when the length of error correction performed during the exit period is larger than the refresh interval tREF (4 ms).

Row-first scan (RFS) and column-first scan (CFS) are often used in addressing which accesses memory cells. RFS is a method which accesses all rows by incrementing row address first, and then increments column addresses. CFS is a method which increments column address first, and then increments row addresses.

In CFS, caution should be exercised because a memory cell retention error occurs if all rows cannot be accessed within tREF=4 ms as the normal interval during the entry or exit period. This error cannot be relieved by the ECC function since it occurs in the middle of the entry/exit period. Accordingly, to satisfy the limitation of tREF=4 ms, the refresh operation must be performed even in the middle of the entry/exit period.

During this refresh operation, if all cell access in entry/exit is to be performed by RFS, the row address is incremented first, so the refresh limitation is satisfied in most cases. On the other hand, if a page operation is to be performed by CFS, a plurality of columns are accessed in one row cycle, so it takes a long time to access all rows. In a semiconductor memory device having a slow clock and a large memory capacity, therefore, the cycle time cannot satisfy the refresh limitation any longer, so the refresh operation must be performed during the course of the process.

From the viewpoint of the entry/exit transition time, however, when a page operation is performed by CFS, the transition time shortens as the page length increases. When RFS is used, on the other hand, the refresh limitation is no longer a big problem, but time intervals such as tRCD from the activation of rows to the start of column access, tWR from a write command to a row precharge command, and tRP from the row precharge command to a next row active command are necessary in one row access. This largely increases the transition time.

Figure 4:
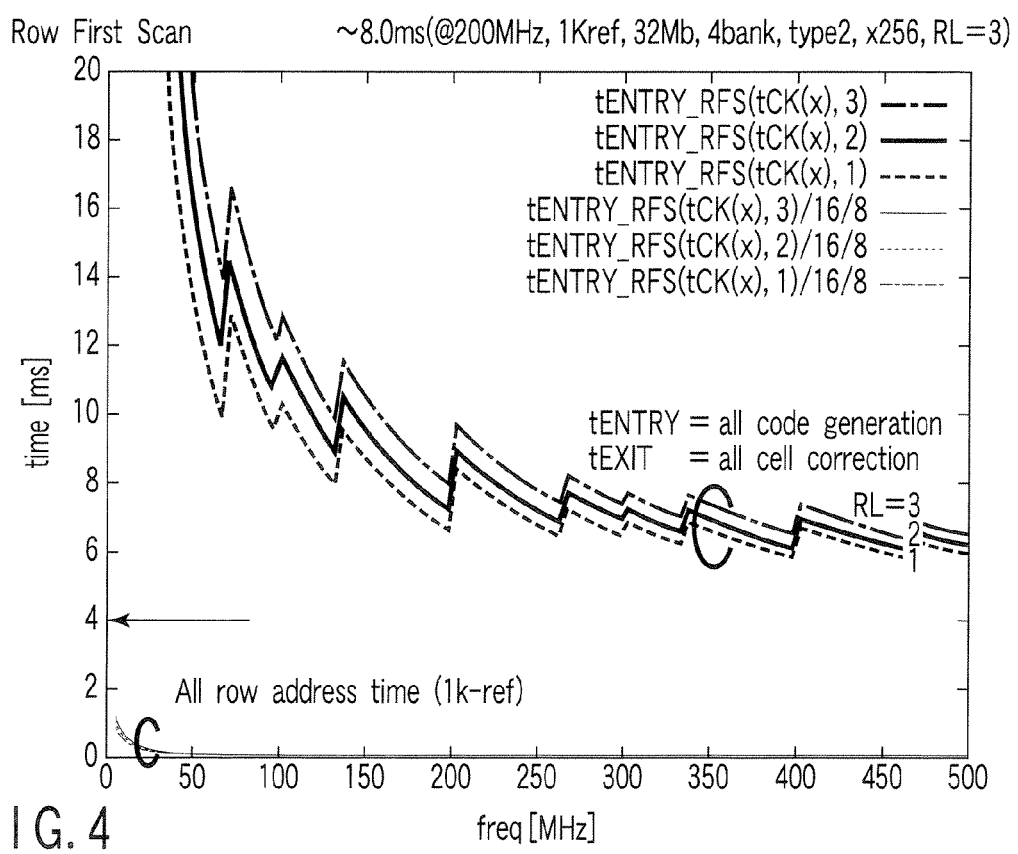
FIG. 4 is a diagram roughly estimating the entry/exit transition time in the case of row-first scan (RFS)
Figure 5:
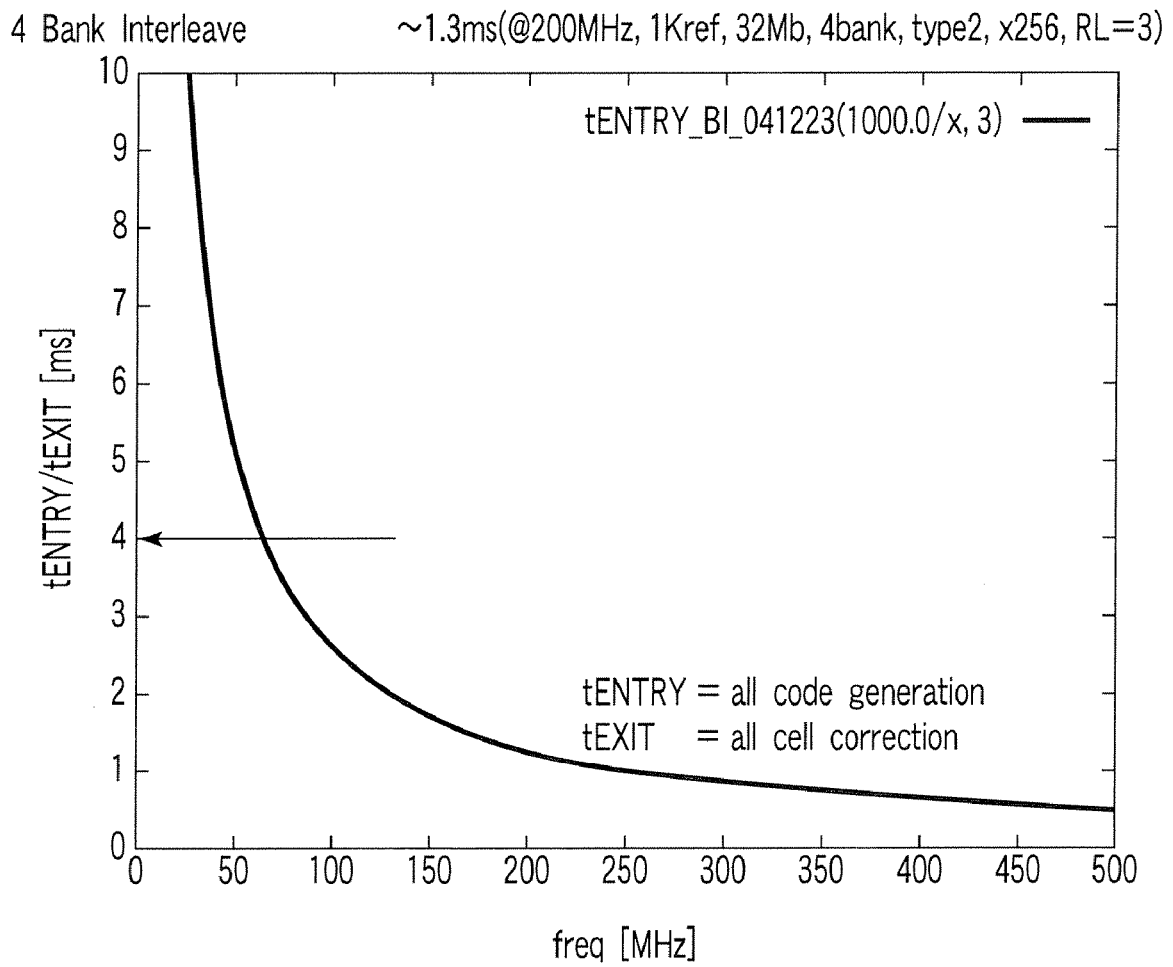
FIG. 5 is a diagram roughly estimating the entry/exit transition time when bank interleave is used.

FIGS. 3 to 5 are graphs roughly estimating the time intervals described above. The arrangement of an assumed semiconductor memory device is as shown in these graphs. FIGS. 3, 4, and 5 illustrate cases which use CFS, RFS, and bank interleave, respectively. More specifically, FIG. 3 shows the relationship between a frequency freq [MHz] and tENTRY (all code generation)/tEXIT (all cell correction) [ms]. If ENTRY/EXIT requires 4 ms or more (indicated by an arrow), refreshing is necessary in the middle of processing. FIG. 4 shows the relationship between the frequency freq [MHz] and time [ms]. Since time [ms]=tENTRY (all code generation)/tEXIT (all cell correction) [ms], no refreshing is necessary even if ENTRY/EXIT requires 4 ms or more. FIG. 5 shows the relationship between the frequency freq [MHz] and tENTRY (all code generation)/tEXIT (all cell correction) [ms] when bank interleave is used. If ENTRY/EXIT requires 4 ms or more (indicated by an arrow), refreshing is necessary in the middle of processing.

As described above, in a DRAM in which the refresh interval during the data holding period is made longer than that in the normal operation to reduce the power consumption in the data holding period, by allowing ECC to function in the data holding mode and performing code generation at the entry and error correction at the exit, when data read and write necessary for the ECC operation are performed by a column-address-priority page operation, the time required to access all cells is sometimes longer than the maximum refresh time.

In this case, it is normally necessary to perform refreshing by interrupting the page operation. In each embodiment of the present invention, however, while an ECC page operation is performed for a certain row, memory cells for which no page access is performed are refreshed, thereby performing code generation or error correction for all memory cells without interrupting the page operation.

A semiconductor memory device according each embodiment of the present invention will be described below with reference to the first to fourth embodiments.

First Embodiment

Figure 6:
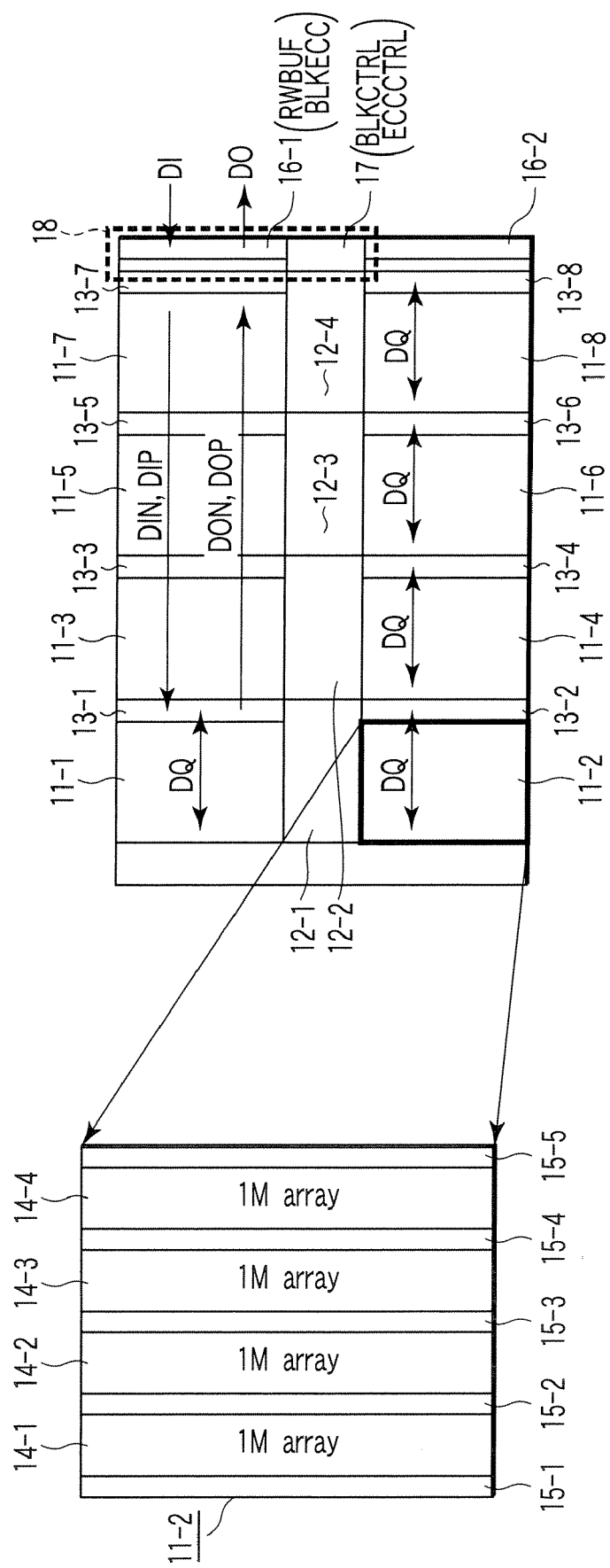
FIG. 6 is a block diagram for explaining an arrangement of a semiconductor memory device according to the first embodiment of the present invention, in which the overall view of a DRAM macro is illustrated.

FIG. 6 is a block diagram for explaining an arrangement of a semiconductor memory device according to the first embodiment of the present invention, in which the overall view of a DRAM macro is schematically illustrated. This DRAM macro includes eight banks (4-Mbit sub macros) 11-1 to 11-8. Decoder blocks 12-1, 12-2, 12-3, and 12-4 are arranged between the banks 11-1 and 11-2, 11-3 and 11-4, 11-5 and 11-6, and 11-7 and 11-8, respectively. Also, secondary sense amplifiers 13-1, 13-2, 13-3, 13-4, 13-5, and 13-6 are arranged between the banks 11-1 and 11-3, 11-2 and 11-4, 11-3 and 11-5, 11-4 and 11-6, 11-5 and 11-7, and 11-6 and 11-8, respectively, and secondary sense amplifiers 13-7 and 13-8 are placed adjacent to the banks 11-7 and 11-8, respectively.

In each of the banks 11-1 to 11-8, as representatively shown by the bank 11-2, 1-Mbit memory cell arrays (1M arrays) 14-1 to 14-4 are arranged. Sense amplifiers 15-1 to 15-5 alternately sandwich the memory cell arrays 14-1 to 14-4.

ECC circuits 16-1 and 16-2 are formed adjacent to the secondary sense amplifiers 13-7 and 13-8, respectively. A read/write buffer (RWBUF), ECC block (BLKECC), and the like are formed in each of the ECC circuits 16-1 and 16-2. In addition, a control circuit 17 is placed in that region between the ECC circuits 16-1 and 16-2, which is adjacent to the decoder block 12-4. The control circuit 17 contains, e.g., a block controller (BLKCTRL) and ECC controller (ECCCTRL).

Data DI is input to the ECC circuits 16-1 and 16-2 from outside the DRAM macro. The data DI is supplied to the secondary sense amplifiers 13-7, 13-5, 13-3, and 13-1, and the secondary sense amplifiers 13-8, 13-6, 13-4, and 13-2, via input data lines DIN and DIP. The input data line DIN transfers normal data, and the input data line DIP transfers parity data. The data DI input to the secondary sense amplifiers 13-1 to 13-8 is supplied to selected memory cells in the memory cell arrays 14-1 to 14-4 via DQ lines in the corresponding banks 11-1 to 11-8 and the sense amplifiers 15-1 to 15-5.

On the other hand, data read out from a memory cell is amplified by one of the sense amplifiers 15-1 to 15-5 which corresponds to one of the memory cell arrays 14-1 to 14-4 which contains this memory cell, and transferred to the DQ line. This data on the DQ line is further amplified by one of the secondary sense amplifiers 13-1 to 13-8, supplied to the ECC circuit 16-1 or 16-2 via output data lines DON and DOP, and output outside as output data DO. The output data line DON transfers normal data, and the output data line DOP transfers parity data.

Figure 7:
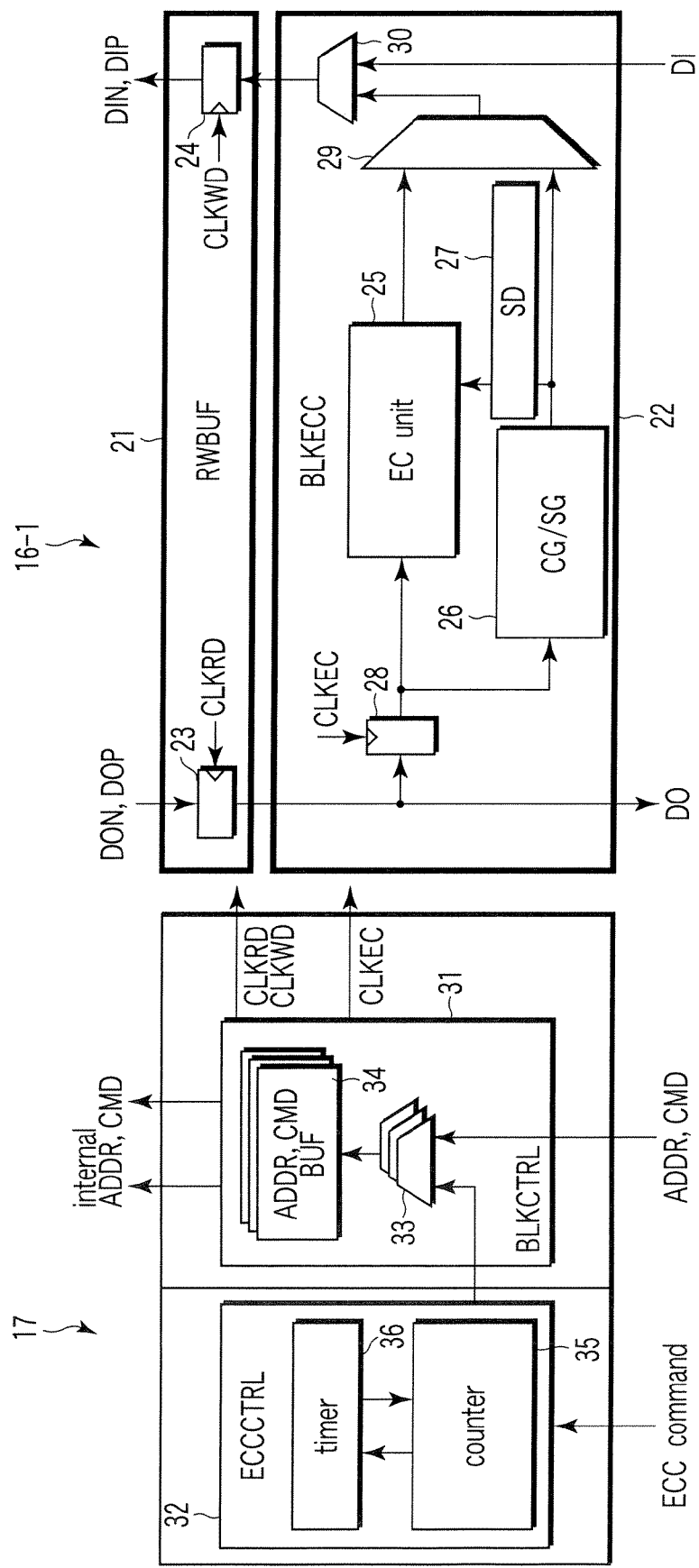
FIG. 7 is a block diagram showing a practical arrangement of a region surrounded by the broken line in the circuit shown in FIG. 6.

FIG. 7 is a block diagram showing a practical arrangement of a region (including the ECC circuit 16-1 and control circuit 17) surrounded by a broken line 18 in the circuit shown in FIG. 6. In the ECC circuit 16-1, a read/write buffer (RWBUF) 21 and ECC block (BLKECC) 22 are formed. The read/write buffer 21 contains a read buffer (flip-flop) 23 which is controlled by a read clock signal CLKRD, and a write buffer (flip-flop) 24 which is controlled by a write clock signal CLKWD. The ECC block 22 contains, e.g., an error correction unit (EC unit) 25, a code generator/syndrome generator (CG/SG) 26, a syndrome decoder (SD) 27, a buffer (flip-flop) 28 which is controlled by an ECC clock signal CLKEC, and multiplexers 29 and 30.

The input data DI is supplied to one input terminal of the multiplexer 30. The other input terminal of the multiplexer 30 receives the output signal from the multiplexer 29. The output signal from the multiplexer 30 is supplied to the buffer 24. The buffer 24 operates in response to the write clock signal CLKWD. In a normal operation, the buffer 24 supplies the input data DI, which is input from outside the DRAM macro, to the input data lines DIN and DIP. The write clock signal CLKWD is activated in synchronism with a write command input to the DRAM macro.

The multiplexer 30 selects the input data DI in the normal operation, i.e., when no ECC is functioning, and selects the output signal from the multiplexer 29 in an ECC operation so that the signal is written in a memory cell.

Data read out from a memory cell to the output data lines DON and DOP is input to the read buffer 23 in response to the read clock signal CLKRD. The read clock signal CLKRD is activated at a timing determined by a read command input to the DRAM macro. The output signal from the buffer 23 is supplied to the buffer 28, and output externally as the output data DO after an elapse of clocks corresponding to the read latency from the read command input timing.

The buffer 28 receives the output signal from the buffer 23 in response to the ECC clock signal CLKEC which lags the clock signal CLKRD by one clock. The output signal from the buffer 28 is supplied to the EC unit 25 and code generator/syndrome generator 26. The output signals from the EC unit 25 and code generator/syndrome generator 26 are supplied to the multiplexer 29. During code generation, the multiplexer 29 selectively outputs check bit data which is output from the code generator/syndrome generator 26. During error correction, the multiplexer 29 selectively outputs data corrected by the EC unit 25 on the basis of error position information obtained by decoding the output syndrome from the code generator/syndrome generator 26 by the syndrome decoder 27.

The control circuit 17 contains a block controller (BLKCTRL) 31 and ECC controller (ECCCTRL) 32. The block controller 31 contains a multiplexer 33 and address and command buffer (ADDR, CMD BUF) 34. The ECC controller 32 contains a counter 35 and timer 36.

An ECC command is supplied to the counter 35, and the output from the counter 35 is supplied to the timer 36. The time measurement result obtained by the timer 36 is supplied to the counter 35. The output signal from the ECC controller 32 and an address and command (ADDR, CMD) are supplied to the multiplexer 33. In the normal operation, the multiplexer 33 selects an address and command from outside the DRAM macro to control the interior of the macro. In the ECC operation, the multiplexer 33 selects an address and command output from the ECC controller 32. The output signal from the multiplexer 33 is supplied to the address and command buffer 34.

An internal address and command are supplied from the address and command buffer 34 to a memory cell. Also, the read clock signal CLKRD, write clock signal CLKWD, and ECC clock signal CLKEC output from the block controller 31 are supplied to the buffers 23, 24, and 28, respectively.

Figure 8:
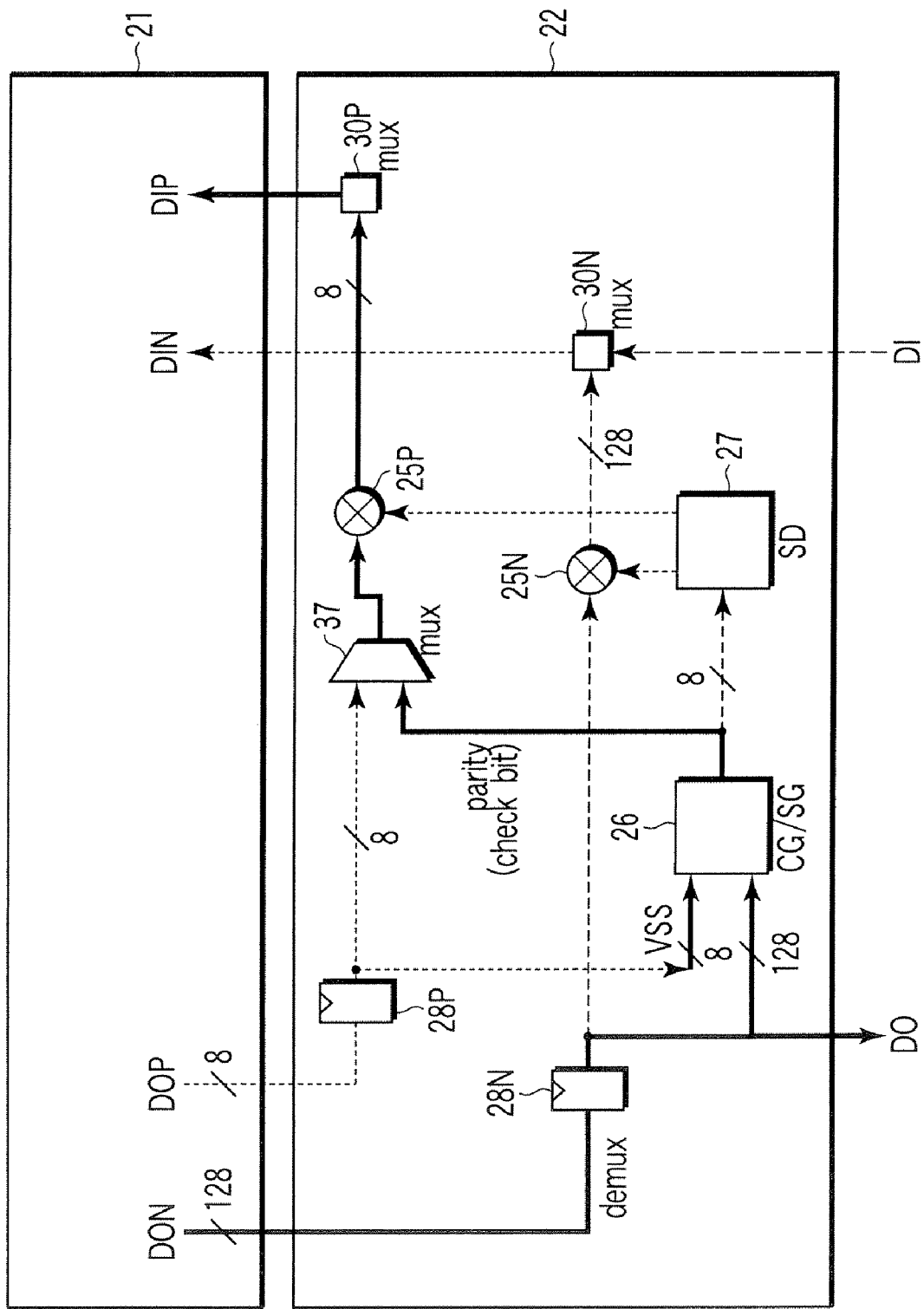
FIG. 8 is a block diagram for explaining the details of a portion which performs an encoding operation in an ECC block shown in FIG. 7.

FIG. 8 is a block diagram showing the details of a portion which performs an encoding operation in the ECC block 22 shown in FIG. 7. The same reference numbers as in FIG. 7 denote the same parts in FIG. 8. Also, reference numbers (25N, 28N, and 30N) suffixed with N denote components for normal data, and reference numbers (25P, 28P, and 30P) suffixed with P denote components for parity data. The information length is 128 bits, and the check symbol length, i.e., parity bits mentioned in the embodiment of the present invention are 8 bits. The code length is "128 bits+8 bits"=136 bits, and 1-bit error correction is performed. When only 64 bits (Half) on one side are to be used, (Full) code generation/error correction is performed by assuming that there are 128 bits on one side.

Referring to FIG. 8, paths for generating parity are indicated by solid line arrows. 128-bit normal data read out from a memory cell array to the output data line DON of the read/write buffer 21 is supplied to a buffer 28N. The 128-bit data output from the buffer 28N and 8-bit parity data fixed to a VSS level are supplied to the code generator/syndrome generator 26. Parity (check bits) generated by the code generator/syndrome generator 26 is supplied to an EC unit 25P via a multiplexer 37, and used in error correction. The 8-bit parity output from the EC unit 25P is supplied to a multiplexer 30P, and then supplied to a memory cell via the input data line DIP.

On the other hand, in FIG. 8, 8-bit parity read data read out to the output data line DOP of the read/write buffer 21 need not be output outside the DRAM macro, and no parity write data is input from outside the DRAM macro. That is, the encoding operation is performed using only data read out from a memory cell array, and no parity data is exchanged with the outside.

Figure 9:
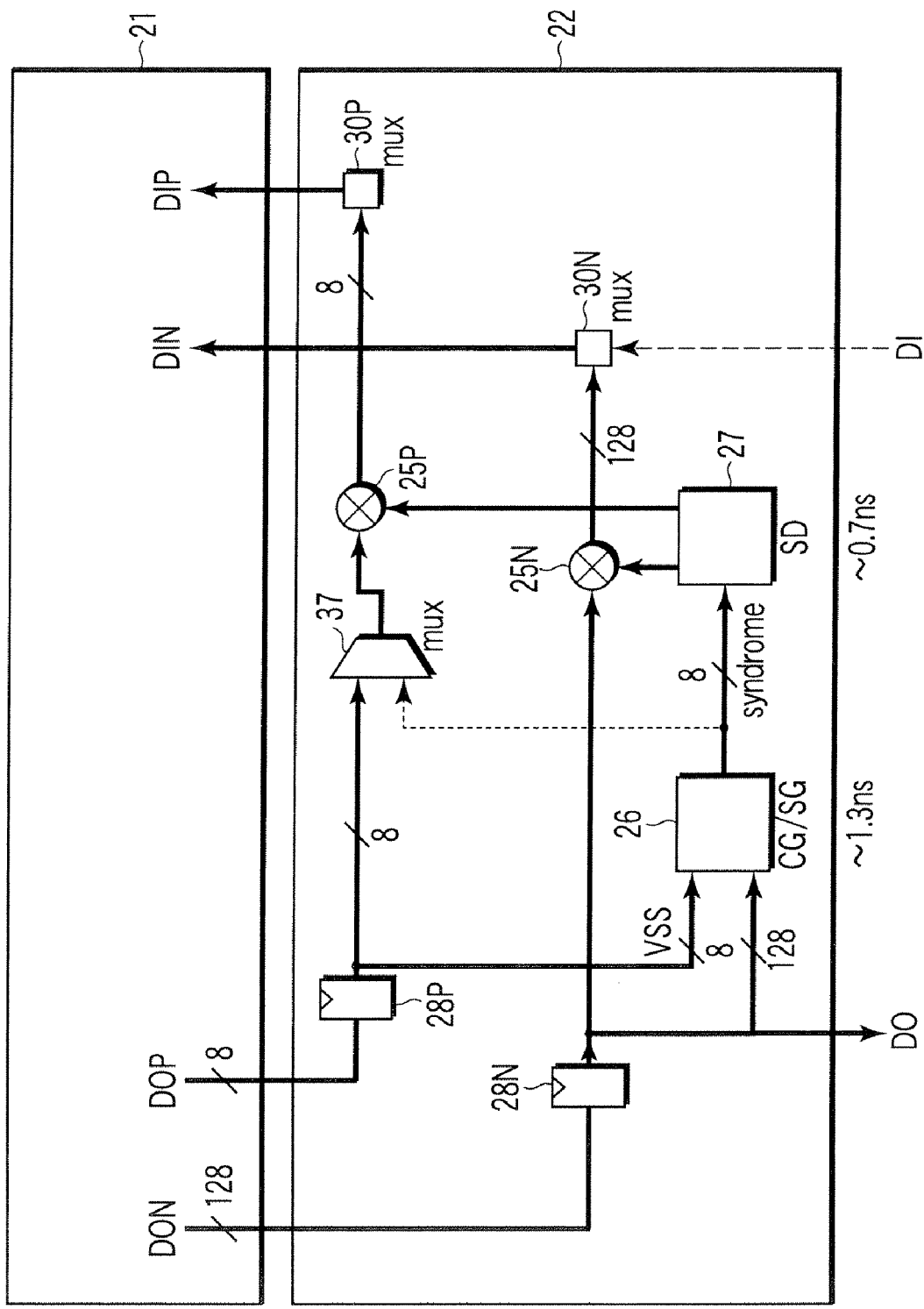
FIG. 9 is a block diagram for explaining the details of a portion which performs a decoding operation in the ECC block shown in FIG. 7.

FIG. 9 is a block diagram showing a portion which performs a decoding operation, i.e., performs syndrome generation, syndrome decoding, and error correction, in the ECC block 22 shown in FIG. 7. The same reference numbers as in FIG. 7 denote the same parts in FIG. 9. Also, as in FIG. 8, reference numbers (25N, 28N, and 30N) suffixed with N denote components for normal data, and reference numbers (25P, 28P, and 30P) suffixed with P denote components for parity data. Referring to FIG. 9, paths for correcting an error are indicated by solid line arrows.

128-bit normal data output from a memory cell array to the output data line DON of the read/write buffer 21 is supplied to a buffer 28N, and 8-bit parity data read out to the output data line DOP is supplied to a buffer 28P. The 128-bit data and 8-bit parity data output from the buffers 28N and 28P, respectively, are supplied to the code generator/syndrome generator 26. The output 128-bit data from the buffer 28N is also supplied to an EC unit 25N, and the output 8-bit parity data from the buffer 28P is also supplied to an EC unit 25P via a multiplexer 37. An 8-bit syndrome generated by the code generator/syndrome generator 26 is supplied to the syndrome decoder 27. During error correction, the syndrome is decoded, and corrected data is selected by controlling the EC units 25P and 25N on the basis of the obtained error position information. The output 8-bit parity from the EC unit 25P is supplied from a multiplexer 30P to a memory cell via the input data line DIP, and the 128-bit data is supplied from a multiplexer 30N to the memory cell via the input data line DIN.

Note that FIGS. 8 and 9 are explained by using a compressed hamming code capable of correcting one error as a code, but any other code can also be used.

Figure 10:
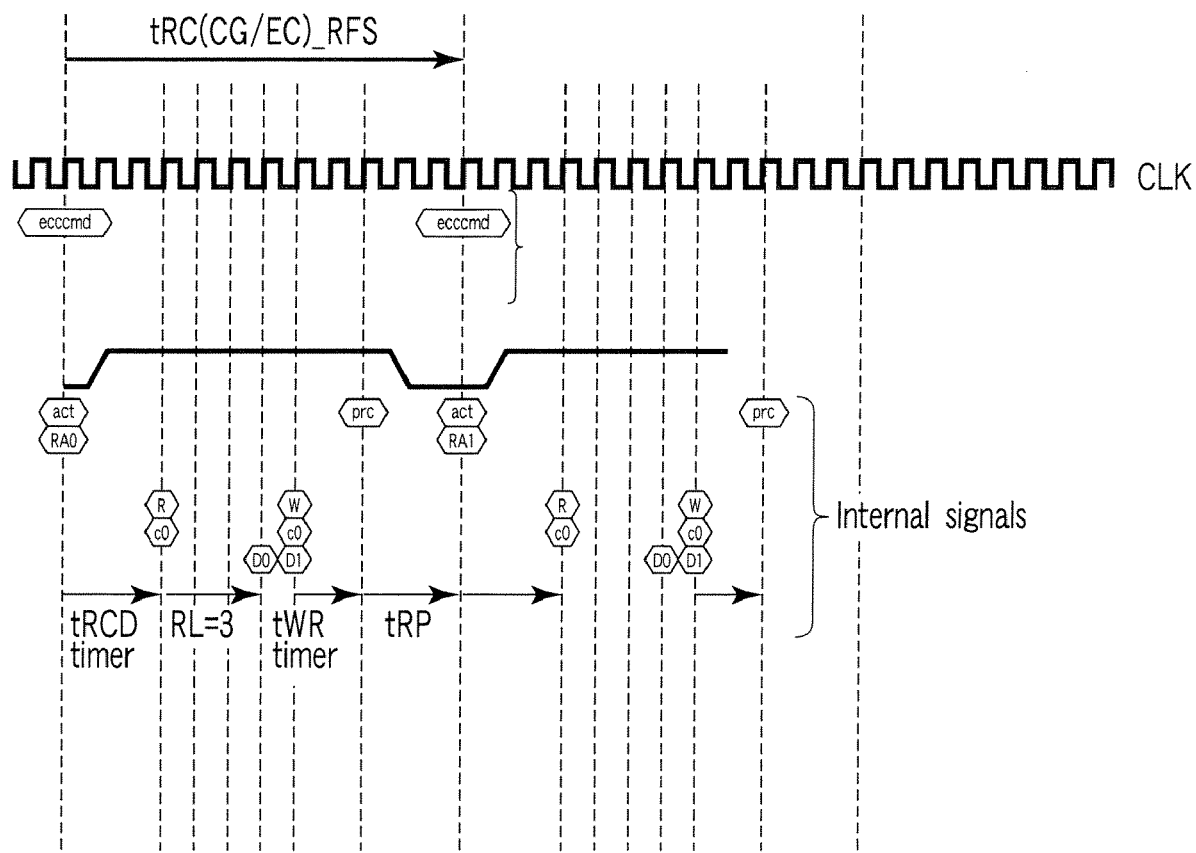
FIG. 10 is a timing chart in the case of RFS.

FIG. 10 shows a timing chart of RFS. In the case of auto-exit/entry, a row cycle start command is externally input, and addresses are generated by an internal counter. In the case of self-exit/entry, an entry/exit command for starting a row cycle is automatically generated by an internal timer, and addresses are generated by the internal counter.

When an entry command <ecccmd> is input and a row active command <act> is successively input (in this case, the row address is <RA0>), the row is activated to raise the potential of a word line. The entry command <ecccmd> corresponds to the input signal <ECC command> to the ECC controller 32 shown in FIG. 7. When the entry command <ecccmd> is input, the row active command <act> in the DRAM macro is activated in synchronism with a system clock CLK, and the row address <RA0> is transmitted to the interior of the macro from the counter 35 in the ECC controller 32. As a consequence, the word line determined by the row address <RA0> is activated.

After an elapse of time tRCD from the input timing of the entry command <ecccmd>, a read command <R> is issued (the column address is <c0>), and 128-bit data (in the exit period, 136-bit data including parity) is read out from a memory cell array. The time tRCD is measured and generated by the timer 36 in the ECC controller 32. Then, a read command <R> is issued to read out data from a memory cell, and a write command <W> for writing data in a memory cell is issued, thereby performing a page operation. The read command <R> and write command <W> are generated in the ECC controller 32, and column addresses <c0> to <c31> are supplied from the counter 35 in the ECC controller 32. When the page operation is completed, a row precharge signal is issued to make the word line unselected after an elapse of time tRW, which is determined by the timer 36, from the last column command.

After an elapse of the read latency (in this case, RL=3) from the generation timing of the read command <R>, data <D0> is input to the ECC circuit, and code generation (in the case of exit, error correction) is performed. In the next cycle, an internal write command <W> (the column address is <c0>) is generated, and parity bits (in the case of exit, corrected data) are written in a memory cell. After an elapse of time tWR from the generation timing of the internal write command <W>, an internal precharge command <prc> is generated, and the row address <RA0> is precharged. After an elapse of time tRP from this timing, a row active command <act> for activating an incremented row address <RA1> is input. After that, a similar operation is repeated by sequentially changing the row address.

FIG. 11 is a timing chart which assumes an operation of page length=32 bits by CFS. A series of row commands are the same as in FIG. 10. In a column operation, however, read commands <R> are successively input in 32 cycles from a column address <c0> to a column address <c31> after an elapse of time tRCD from a row active command <act>. Since the read latency (RL) is 3, read data <Q0> is output after an elapse of RL=3 with respect to a command <R> for the first column address <c0>. For the read data <Q0>, an output <D0> from the ECC circuit is output after an elapse of one cycle. After read is performed in 32 consecutive columns, no-operation (NOP) commands <N> are input in 3 cycles, and write commands <w> for the column addresses <c0> to <c31> are successively input in 32 columns after that. This write data contains parity bits generated by the ECC circuit or is corrected decoded data <Di>, with respect to each read data <Qi> obtained by read. To implement this operation, 32 (page length)×136 bits (code length) registers suffice.

Although various ECC page operations are possible, an explanation of detailed differences between the methods is not the main purpose of the present invention. To simplify the explanation, therefore, an example as shown in FIGS. 12A to 12D will be described below.

Assume that the capacity of a DRAM is 16 Mbits, and this 16-Mbit DRAM is divided into 16 1-Mbit subarrays. Each subarray includes 512 word lines WL, 2,048 bit line pairs, a parity bit line pair for storing parity bits of an error correcting code used in ECC, and memory cells formed at the intersections of the word lines and bit lines. The error correcting code will be omitted because it is not directly relevant to the present invention.

Only one word line in a subarray is activated by one row access. 128-bit data is read out from the activated word line by one column access. That is, all memory cells connected to one word line can be accessed by performing column access 16 times.

The whole 16-Mbit DRAM has 8,192 word lines. Assume that the DRAM has a 1K refresh configuration, i.e., all cells are refreshed by performing row access 1,024 times. That is, eight word lines are simultaneously activated by one row access in normal refresh.

First, an ECC page operation which performs no refresh in the background will be explained below. In the above example, as shown in FIG. 12A, 32 columns, i.e., all memory cells connected to two word lines are accessed by one row access when the page length is 32. When a row is made active with respect to row address 0, word lines of corresponding subarrays 0 and 2 are activated. Accordingly, two word lines are simultaneously activated. For these two word lines, a read operation is performed in 32 consecutive columns, and the output from the ECC circuit with respect to the read data is written by a write operation performed in 32 consecutive columns. When the word lines are deactivated after that, they are precharged. Then, the row address is incremented by one, and the page operation is performed for the next word lines. When row access including the page operation is performed 1,024 times, data is read out from all memory cells included in subarrays 0 to 3. At the entry, a code is generated by the ECC circuit, and written in a memory cell. At the exit, an error-corrected code is rewritten.

As shown in FIG. 12B, all memory cells in subarrays 4 to 7 are accessed by 1,024-time row access including the next page operation having a page length of 32. Furthermore, memory cells in subarrays 8 to 11 are accessed by 1,024-time row access as shown in FIG. 12C, and memory cells in subarrays 12 to 15 are accessed by 1,024-time row access as shown in FIG. 12D. In this manner, all memory cells of the 16 Mbits are accessed by performing row access 4×1,024=4,096 times. In this example, 4×1,024=4,096-time row access is necessary to access all word lines as well.

The access time of all cells when a page length g is changed will be described below. First, a row cycle time tRCP(g) necessary for the ECC page operation is $$tRCP(g)=tRCD+(2\times g+\alpha)\times tCK+tWR+tRP$$

where tRCD is the time required from a row active command to a column read command, tCK is a clock cycle time, tWR is the time required from a column write command to a row precharge command, and tRP is the time required from the row precharge command to the next row active command.

Note that $\alpha$ is the read latency, i.e., the number of clocks from a read command to the timing when data is input to the ECC circuit, or the clock time necessary for the operation of the ECC circuit, and changes in accordance with the page length or the pipeline configuration of the circuit. However, $\alpha$ is not practically related to the explanation of the essential part of the present invention, and hence is ignored as $\alpha=0$. This yields $$tRCP(g)=tRCD+2\times g\times tCK+tWR+tRP$$

The individual values are assumed as follows. That is, assume that the frequency is 20 MHz, i.e., tCK=50 ns, and therefore tRCDmin=15 ns, tWRmin=10 ns, and tRPmin=15 ns. Although it is also possible to generate command timings from an internal timer to make them asynchronous with external clocks, assume that all commands are issued in synchronism with the clocks. Since each command requires one cycle, the actual values are tRCD=50 ns, tWR=50 ns, and tRP=50 ns.

The row cycle time is tRC(g)=150+50×g [ns] with respect to the page length g. In normal refresh in which no column access is performed, the row cycle time tRCREF is approximately $$tRCREFmin=tRCDmin+tWRmin+tRPmin=40\ ns$$

This value is actually tRCREF=50 ns by assuming that it is synchronized with the external clock.

Letting tRF be the time required when 1,024 refresh cycles necessary for total refresh are successively performed, in other words, letting tRF be the time required before the end of centralized refresh, $$tRF=1024\times tRCREF=51200[ns]\approx51.2\ [\mu s]$$

On the other hand, letting tEC be the time required for all cell access by the ECC page operation, and tED be the time required to activate all word lines at least once by the ECC page operation, the following equations hold for the page length g.

$$tEC(g)=8\times 16/g\times 1024\times tRCP$$

$$tED(g)=tEC(g)$$

where tED and tEC are equal.

The times tRCP, tEC, and tED are calculated as follows with respect to page length g=16, 32, 64, and 128.

g=16, tRCP=1750 [ns], tEC=14336 [μs], tED=14336 [μs]

g=32, tRCP=3350 [ns], tEC=13722 [μs], tED=13722 [μs]

g=64, tRCP=6550 [ns], tEC=13414 [μs], tED=13414 [μs]

g=128, tRCP=12950 [ns], tEC=13261 [μs], tED=13261 [μs]

These values demonstrate that when tCK=50 ns, the limitation that all rows must be activated at least once within tREF when refresh period tREF=4 ms is not satisfied because tED>tREF regardless of whether the page length g is any of 16 to 128.

For example, when tCK=15 ns, g=16, tRCP=525 [ns], tEC=4301 [μs], tED=4301 [μs]

g=32, tRCP=1005 [ns], tEC=4116 [μs], tED=4116 [μs]

g=64, tRCP=1965 [ns], tEC=4024 [μs], tED=4024 [μs]

g=128, tRCP=3885 [ns], tEC=3978 [μs], tED=3978 [μs]

Therefore, when page length g=128, tED<tREF=4 ms

Accordingly, the refresh limitation is met, but the limitation of tED<tREF=4 ms cannot be met if g=16, 32, and 64.

Figures 13, 14:
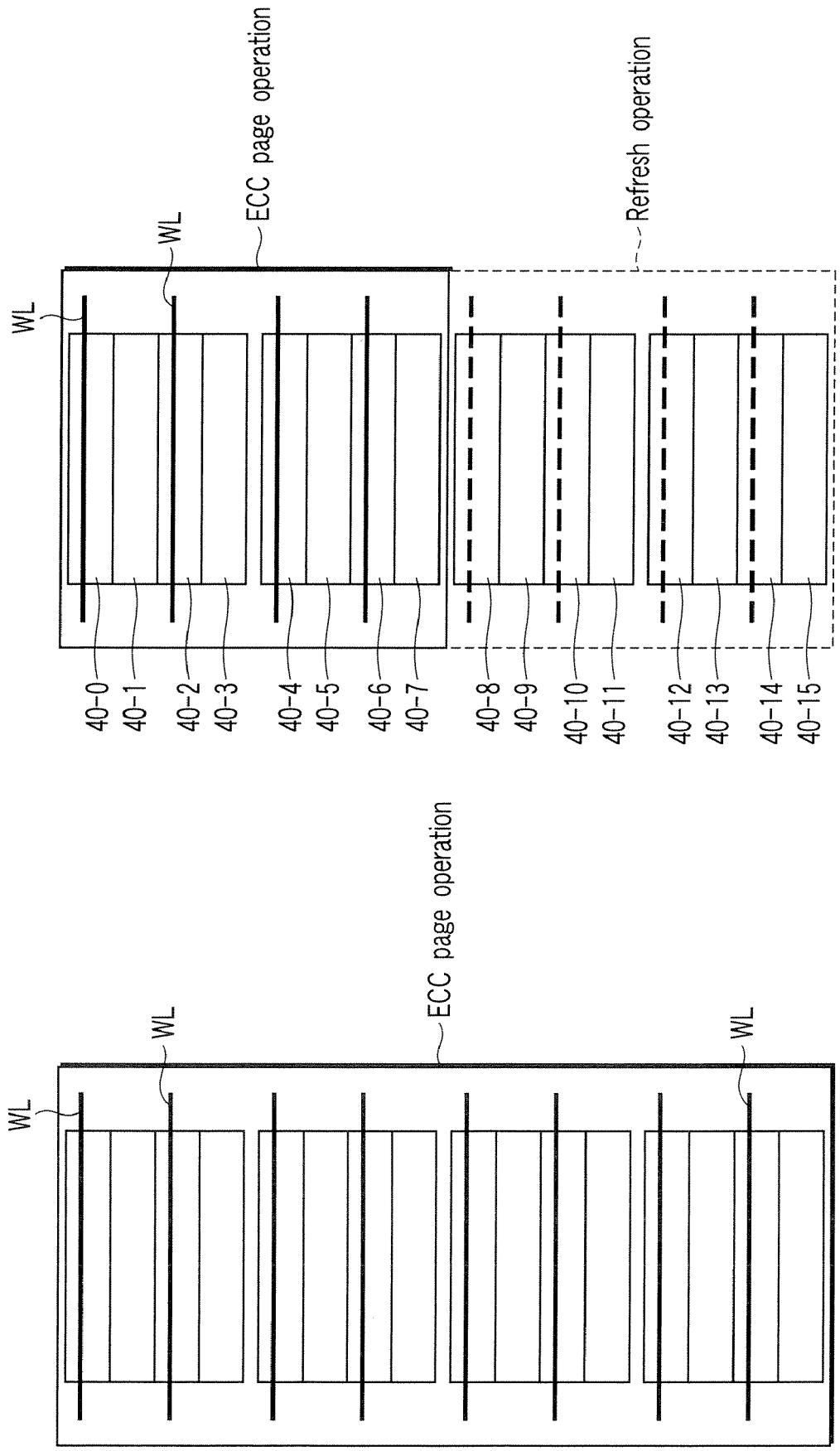
FIG. 13 is a schematic view for explaining word lines to be activated when the page length is 128.
FIG. 14 is a schematic view for explaining the semiconductor memory device according to the first embodiment of the present invention, in which a word line selected state when the page length is 64 is illustrated.

FIG. 13 shows a case in which 16 columns×8 word lines=page length because it is assumed that eight word lines are simultaneously activated when page length g=128, i.e., the number of columns per word line is 16.

As described above, when the clock cycle time is slow, the refresh limitation cannot be met in some cases if all cells are accessed by performing ECC read and write by the page mode. To avoid this inconvenience, it is necessary to perform refresh by interrupting the page access to all the cells.

In the first embodiment of the present invention, therefore, as in an example shown in FIG. 14, the page length g is set to 64, and, when four upper word lines are selected and accessed by the page mode, memory cells in the lower half are refreshed at the same time by selecting four word lines, thereby satisfying the refresh limitation. Referring to FIG. 14, 1-Mb subarrays 40-0 to 40-7 as objects of the ECC page operation are indicated by the solid lines, and 1-Mb subarrays 40-8 to 40-15 as objects of refresh are indicated by the broken lines.

Figure 15:
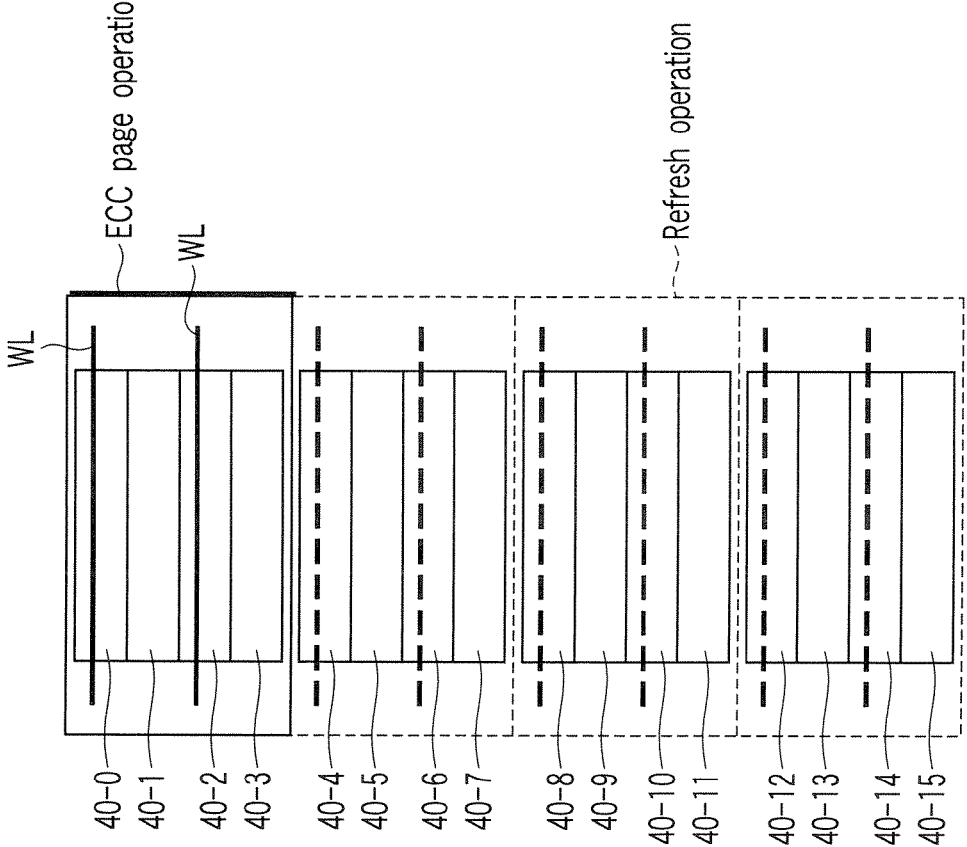
FIG. 15 is a schematic view for explaining the semiconductor memory device according to the first embodiment of the present invention, in which a word line selected state when the page length is 32 is illustrated.

As shown in FIG. 15, it is also possible to set the page length g to 32, and refresh subarrays except for those including two word lines to be accessed by the activation page mode. That is, of word lines of unselected subarrays, a total of eight word lines are simultaneously selected by selecting six extra word lines. Referring to FIG. 15, 1-Mb subarrays 40-0 to 40-3 as objects of the ECC page operation are indicated by the solid lines, and 1-Mb subarrays 40-4 to 40-15 as objects of refresh are indicated by the broken lines.

Figure 16:
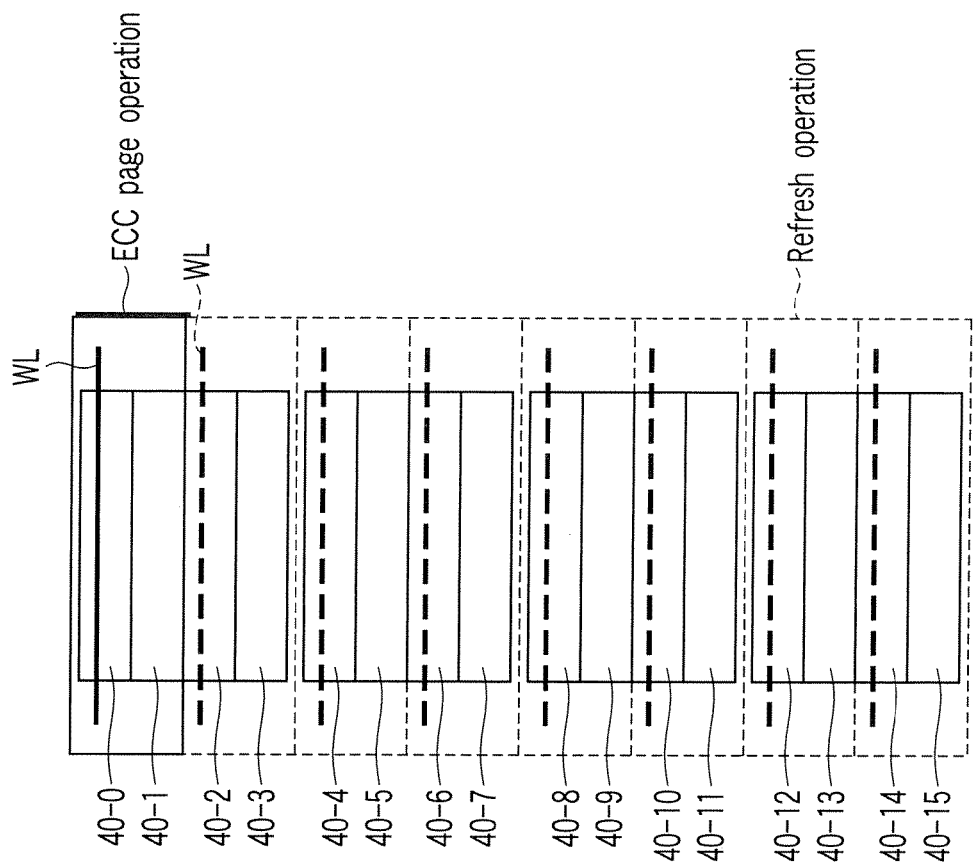
FIG. 16 is a schematic view for explaining the semiconductor memory device according to the first embodiment of the present invention, in which a word line selected state when the page length is 16 is illustrated.

FIG. 16 shows a case in which the page length is 16. In this case, only one word line is accessed by the page mode. Accordingly, it is only necessary to simultaneously select and activate seven word lines from subarrays which are not accessed by the page mode. Referring to FIG. 16, 1-Mb subarrays 40-0 and 40-1 as objects of the ECC page operation are indicated by the solid lines, and 1-Mb subarrays 40-2 to 40-15 as objects of refresh are indicated by the broken lines.

Note that it is assumed that a sense amplifier is shared by adjacent subarrays, and a subarray adjacent to a subarray having activated word lines cannot be made active. When page length=64, access to all cells is completed by 2,048-time row access. When page length=32, access to all cells is completed by 4,096-time row access. When page length=16, access to all cells is completed by 8,192-time row access.

In the first embodiment, all the 8,192 word lines can be accessed by performing row access 1,024 times in any case.

The times will be calculated in the same manner as in the prior art.

Letting tEC be the time required for access to all cells by the ECC page operation, and tED be the time required to activate all word lines at least once by the ECC page operation, the following equations hold for the page length g.

$$tEC(g) = 8 \times 16/g \times 1024 \times tRCP$$

$$tED(g) = 1024 \times tRCP$$

where tED and tEC are not equal unlike in the prior art.

Whether the first embodiment can meet the refresh limitation will be confirmed below on the basis of the above examples.

When tCK=50 ns, g=16, tRCP=1750 [ns], tEC=14336 [μs], tED=1792 [μs]

g=32, tRCP=3350 [ns], tEC=13722 [μs], tED=3430 [μs]

g=64, tRCP=6550 [ns], tEC=13414 [μs], tED=6707 [μs]

g=128, tRCP=12950 [ns], tEC=13261 [μs], tED=13261 [μs]

When page length g=16 and 32, therefore, the refresh limitation of tED<tREF=4 ms can be satisfied.

When tCK=15 ns g=16, tRCP=525 [ns], tEC=4301 [μs], tED=538 [μs]

g=32, tRCP=1005 [ns], tEC=4116 [μs], tED=1029 [μs]

g=64, tRCP=1965 [ns], tEC=4024 [μs], tED=2012 [μs]

g=128, tRCP=3885 [ns], tEC=3978 [μs], tED=3978 [μs]

Accordingly, the refresh limitation can be satisfied in all cases where g=16, 32, 64, and 128.

Second Embodiment

In the first embodiment described above, when clock cycle time tCK=50 ns in the last example, the limitation of tED<tREF=4 ms cannot be satisfied if page length g=64. Therefore, the second embodiment eliminates this limitation.

Figures 17A, 17B:
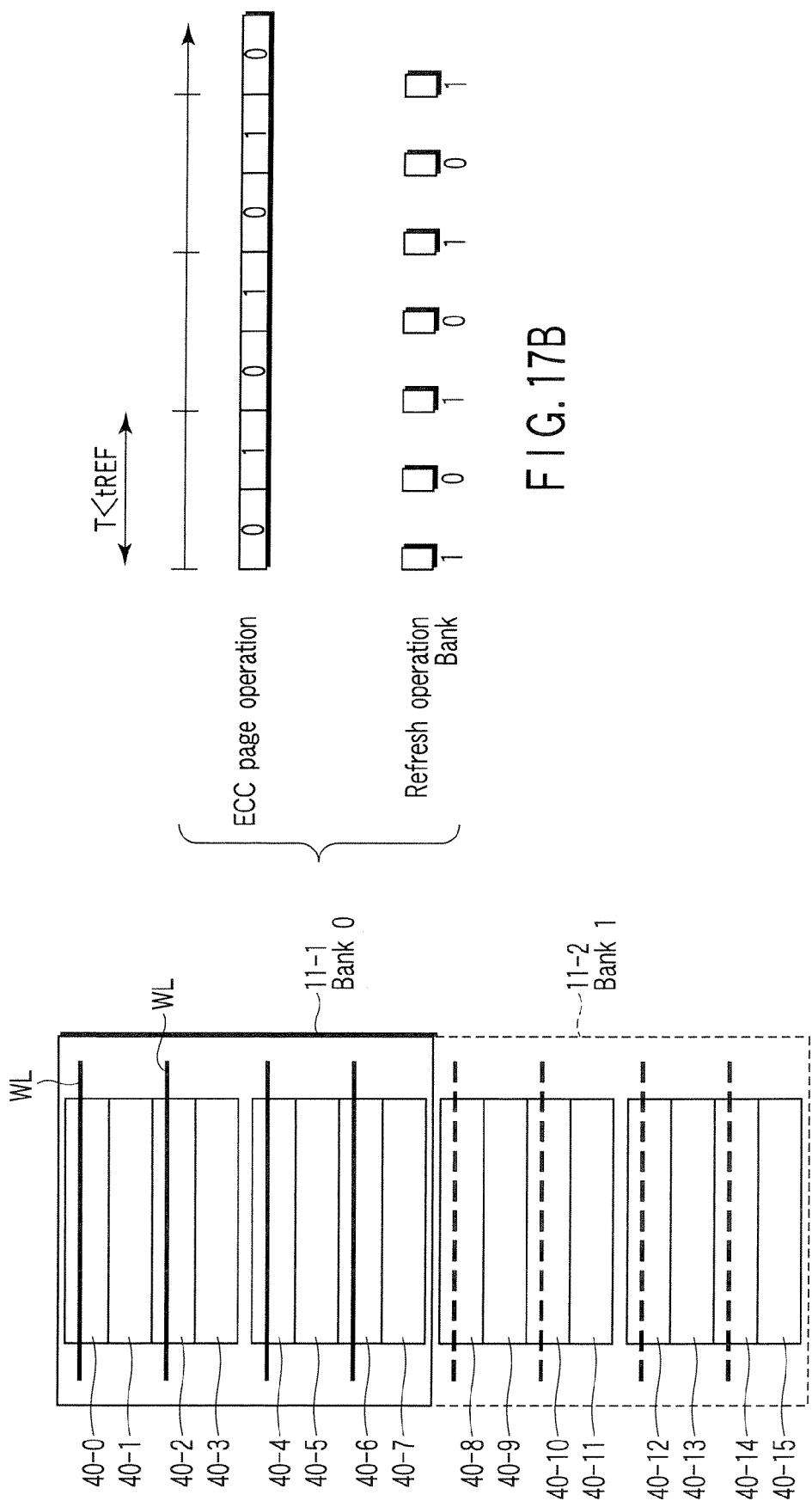
FIGS. 17A and 17B are schematic views for explaining a semiconductor memory device according to the second embodiment of the present invention.

That is, as shown in FIG. 17A, a DRAM macro is divided into, e.g., two banks 11-1 and 11-2 (banks 0 and 1). These banks 0 and 1 are alternately operated as indicated by (1) and (2) below.

(1) During a period in which code generation/error correction (ECC page operation) is performed for bank 0, bank 1 is refreshed at the same time.

(2) During a period in which code generation/error correction is performed for bank 1, bank 0 is refreshed at the same time.

Note that in the second embodiment, unlike in the first embodiment, word lines activated in banks 0 and 1 have no correspondence.

As described above, all word lines in banks 0 and 1 are activated in the refresh period, and all memory cells are refreshed within a maximum refresh time tREF.

Assuming that T is smaller than the maximum refresh time tREF (T<tREF) as shown in FIG. 17B, an ECC page operation is performed for bank 0 in a period of 0<t<T/2. This ECC page operation for bank 0 is performed for word lines WL0 to WL(n−1). At the same time, bank 1 is refreshed. This refreshing of bank 1 is performed in 1,024 row cycles, and memory cells connected to the word lines WL0 to WL1023, WL1024 to WL2047, WL2048 to WL3071, and WL3072 to WL4094 are sequentially refreshed. Also, in a period of T/2<t<T, bank 0 undergoes a refresh operation, and bank 1 undergoes an ECC page operation. The refreshing of bank 0 is performed in 1,024 row cycles as in bank 1, and memory cells connected to the word lines WL0 to WL1023, WL1024 to WL2047, WL2048 to WL3071, and WL3072 to WL4094 are sequentially refreshed. An ECC page operation for next bank 0 is performed for word lines WLn1 to WL(2×n−1).

The above operation is sequentially repeated. Letting n be a natural number, in a period of n×T<t<(n+1)/2)×T, bank 0 undergoes an ECC page operation, and bank 1 undergoes a refresh operation. Also, in a period of (n+½)×T<t<(n+1)×T, bank 0 undergoes a refresh operation, and bank 1 undergoes an ECC page operation. In this manner, all memory cells can be refreshed within the maximum refresh time tREF.

Note that even if the ECC page operation for all memory cells in bank 0 has not been completed within the time T/2, it is only necessary to repeat this operation, so the operation need not be interrupted in order to perform refresh.

The second embodiment can eliminate the limitation produced in the first embodiment described earlier.

Third Embodiment

Although a DRAM macro is divided into two banks in the above second embodiment, it may also be divided into 2N (N is a positive integer) banks. The third embodiment shown in FIG. 18 indicates a case in which N=2. That is, assuming that 0≦j<N, bank N+j is refreshed while an ECC page operation is performed in bank j. Likewise, bank j is refreshed while an ECC page operation is performed in bank N+j. All banks j=0 to 2N−1 need only be refreshed within a maximum refresh time tREF.

By repeating this operation, an ECC page operation for all the banks can be completed without being interrupted.

Fourth Embodiment

Although a DRAM macro is divided into 2N banks in the above third embodiment, it is divided into N banks in the fourth embodiment. In an example shown in FIG. 19, N=4.

That is, assuming that 0≦j<N, bank j+1 mod N where "mod N" means the remainder for which N is the quotient is refreshed while an ECC page operation is performed in bank j. When 0≦j<N−1, j+1 mod N=j+1. When j=N−1, j+1 mod N=0.

As in the second and third embodiments, all banks j=0 to 2N−1 need only be refreshed within a maximum refresh time tREF. By repeating this process, an ECC page operation for all the banks can be completed without being interrupted.

In the semiconductor memory devices according to the first to fourth embodiments described above, in a memory requiring refresh, e.g., in a DRAM, at the entry to the data holding mode capable of reducing the power consumption, the operation of reading out data from the memory, generating an error correcting code, and writing the code in the memory is performed for all memory cells. At the exit, the operation of reading out code bits from the memory, correcting an error, and rewriting the code bits in the memory is performed for all the memory cells.

This makes it possible to improve the retention characteristics, extend the refresh interval, and reduce the power consumption. In addition, the transition time between the data holding mode and normal operation mode can be shortened by performing an entry/exit operation as this transition time by a page mode operation. Also, since the page mode need not be interrupted by inserting a refresh operation, the time can be further shortened.

Accordingly, it is possible to simplify the command input sequence and control, and shorten the transition time from the normal operation mode to the data holding mode and the transition time from the data holding mode to the normal operation mode.

As described above, according to one aspect of this invention, there is provided a semiconductor memory device capable of simplifying the command input sequence and control, and shortening the transition time from the normal operation mode to the data holding mode and the transition time from the data holding mode to the normal operation mode.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
memory cells which dynamically hold data;
ECC circuits configured to perform error correction on codes read out from the memory cells; and
a control circuit configured to control operations of the memory cells and operations of the ECC circuits, the control circuit performing control such that when the memory cells enter an operation mode which performs only data holding, a plurality of data are read out to generate and store a check bit for error detection and correction, and refresh is performed, and, before a normal operation mode is restored from the operation mode which performs only data holding, an error bit of the data is corrected by using the check bit,
wherein in an entry/exit period, read/write and an ECC operation are sequentially performed for all the memory cells by a page mode operation, while memory cells connected to a word line which is not accessed by the page mode operation are sequentially activated and refreshed.

2. A device according to claim 1, wherein the refresh is performed in a period within an error occurrence allowable range of the error correcting operation performed by the ECC circuit by using the check bit.

3. A device according to claim 1, wherein a plurality of word lines which are not accessed by the page mode operation are simultaneously activated to refresh the memory cells.

4. A device according to claim 1, wherein the memory cells, the ECC circuits, and the control circuit are parts of a DRAM macro.

5. A device according to claim 4, wherein
the DRAM macro comprises a plurality of banks, secondary sense amplifiers formed between banks arranged along a first direction in which an input data line, an output data line, and a DQ line run in said plurality of banks, and decoder blocks formed between banks arranged along a second direction which intersects the first direction, and
the ECC circuits are arranged adjacent to the secondary sense amplifiers at one end of the banks arranged along the first direction, and the control circuit is placed between the ECC circuits.

6. A device according to claim 5, wherein each of said plurality of banks comprises a plurality of memory cell arrays in which the memory cells are arranged, and sense amplifiers which alternately sandwich said plurality of memory cell arrays.

7. A device according to claim 1, wherein
the ECC circuit comprises a read/write buffer and an ECC block, and
the ECC block comprises an EC unit, a code generator/syndrome generator, a syndrome decoder, and a buffer which is controlled by an ECC clock signal.

8. A device according to claim 4, wherein
the ECC circuit comprises a read/write buffer and an ECC block,
the read/write buffer comprises a read buffer controlled by a read clock signal, and a write buffer controlled by a write clock signal, and
the ECC block comprises a buffer which is controlled by an ECC clock signal and receives readout data from the memory cells, an EC unit which receives an output signal from the buffer and corrects an error, a code generator/syndrome generator which generates a code and a syndrome on the basis of the output signal from the buffer, a syndrome decoder which decodes the syndrome generated by the code generator/syndrome generator, a first multiplexer which selects one of an output signal from the EC unit and an output signal from the code generator/syndrome generator, and a second multiplexer which selects one of an output signal from the first multiplexer and data input from outside the DRAM macro.

9. A device according to claim 1, wherein
the control circuit comprises an ECC controller and a block controller,
the ECC controller comprises a counter and a timer, and
the block controller comprises a multiplexer and an address and command buffer.

10. A device according to claim 4, wherein
the control circuit comprises an ECC controller and a block controller,
the ECC controller comprises a counter which receives an entry command, and a timer which receives an output from the counter, and generates a signal for setting an operation timing, and
the block controller comprises a multiplexer which receives an output signal from the ECC controller and an address and command input from outside the DRAM macro, controls an interior of the DRAM macro by selecting the address and the command in a normal operation, and selects the output signal from the ECC controller in an ECC operation, and an address and command buffer which receives an output signal from the multiplexer, an address, and a command, supplies an internal address and a command to the memory cells, and supplies a read clock signal, a write clock signal, and an ECC clock signal to the ECC circuit.

11. A semiconductor memory device comprising:
a plurality of banks having memory cell arrays in which memory cells which dynamically hold data are arranged;
ECC circuits configured to perform error correction on codes read out from the memory cells; and
a control circuit configured to control operations of the memory cells and operations of the ECC circuits, the control circuit performing control such that when the memory cells enter an operation mode which performs only data holding, a plurality of data are read out to generate and store a check bit for error detection and correction, and refresh is performed, and, before a normal operation mode is restored from the operation mode which performs only data holding, an error bit of the data is corrected by using the check bit,
wherein in an entry/exit period, read/write and an ECC operation are sequentially performed for all the memory cells by a page mode operation, and, in the entry/exit period, one bank is accessed by an ECC page mode, another bank is refreshed while the read/write and the ECC operation are performed.

12. A device according to claim 11, wherein
the refresh is performed in a period within an error occurrence allowable range of the error correcting operation performed by the ECC circuit by using the check bit,
the ECC page mode is not interrupted by the refresh, and
the refresh is performed for all the memory cells within a predetermined time.

13. A device according to claim 11, wherein a plurality of word lines which are not accessed by the page mode operation are simultaneously activated to refresh the memory cells.

14. A device according to claim 11, wherein said plurality of banks, the ECC circuits, and the control circuit are parts of a DRAM macro.

15. A device according to claim 14, wherein
the DRAM macro comprises secondary sense amplifiers formed between banks arranged along a first direction in which an input data line, an output data line, and a DQ line run in said plurality of banks, and decoder blocks formed between banks arranged along a second direction which intersects the first direction, and
the ECC circuits are arranged adjacent to the secondary sense amplifiers at one end of the banks arranged along the first direction, and the control circuit is placed between the ECC circuits.

16. A device according to claim 15, wherein each of said plurality of banks comprises a plurality of memory cell arrays in which the memory cells are arranged, and sense amplifiers which alternately sandwich said plurality of memory cell arrays.

17. A device according to claim 11, wherein
the ECC circuit comprises a read/write buffer and an ECC block, and
the ECC block comprises an EC unit, a code generator/syndrome generator, a syndrome decoder, and a buffer which is controlled by an ECC clock signal.

18. A device according to claim 14, wherein
the ECC circuit comprises a read/write buffer and an ECC block,
the read/write buffer comprises a read buffer controlled by a read clock signal, and a write buffer controlled by a write clock signal, and
the ECC block comprises a buffer which is controlled by an ECC clock signal and receives readout data from the memory cells, an EC unit which receives an output signal from the buffer and corrects an error, a code generator/syndrome generator which generates a code and a syndrome on the basis of the output signal from the buffer, a syndrome decoder which decodes the syndrome generated by the code generator/syndrome generator, a first multiplexer which selects one of an output signal from the EC unit and an output signal from the code generator/syndrome generator, and a second multiplexer which selects one of an output signal from the first multiplexer and data input from outside the DRAM macro.

19. A device according to claim 11, wherein
the control circuit comprises an ECC controller and a block controller, the ECC controller comprises a counter and a timer, and
the block controller comprises a multiplexer and an address and command buffer.

20. A device according to claim 14, wherein
the control circuit comprises an ECC controller and a block controller,
the ECC controller comprises a counter which receives an entry command, and a timer which receives an output from the counter, and generates a signal for setting an operation timing, and
the block controller comprises a multiplexer which receives an output signal from the ECC controller and an address and command input from outside the DRAM macro, controls an interior of the DRAM macro by selecting the address and the command in a normal operation, and selects the output signal from the ECC controller in an ECC operation, and an address and command buffer which receives an output signal from the multiplexer, an address, and a command, supplies an internal address and a command to the memory cells, and supplies a read clock signal, a write clock signal, and an ECC clock signal to the ECC circuit.

* * * * *